US011307266B2

(12) United States Patent
Cao et al.

(10) Patent No.: US 11,307,266 B2
(45) Date of Patent: Apr. 19, 2022

(54) CORE LOSS CHARACTERIZATION AND MEASUREMENT

(71) Applicant: VIRGINIA TECH INTELLECTUAL PROPERTIES, INC., Blacksburg, VA (US)

(72) Inventors: Yuliang Cao, Blacksburg, VA (US); Minh Ngo, Blacksburg, VA (US); Dong Dong, Blacksburg, VA (US); Rolando Burgos, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 24 days.

(21) Appl. No.: 17/006,058

(22) Filed: Aug. 28, 2020

(65) Prior Publication Data
US 2022/0065950 A1 Mar. 3, 2022

(51) Int. Cl.
*G01R 31/62* (2020.01)
*G01R 33/12* (2006.01)
*G01R 31/72* (2020.01)

(52) U.S. Cl.
CPC .......... *G01R 31/62* (2020.01); *G01R 31/72* (2020.01); *G01R 33/123* (2013.01)

(58) Field of Classification Search
CPC ....... G01R 31/62; G01R 31/72; G01R 33/123
USPC ...................................................... 324/222
See application file for complete search history.

(56) References Cited

U.S. PATENT DOCUMENTS

2013/0049744 A1\* 2/2013 Mu ................... G01R 33/1207
324/222
2020/0011944 A1\* 1/2020 Kawano ................ G01R 33/12

OTHER PUBLICATIONS

Mingkai Mu et al., New Core Loss Measurement Method for High-Frequency Magnetic Materials, 29 IEEE Trans. Pwr. Elec. 4374 (Aug. 2014) (Year: 2014).\*
Moosavi et al., Soft-Switching Push-Pull Converter with Parallel Resonant Link and Buck-Boost Capability, 2016 IEEE Energy Conv. Congress & Expo. (Feb. 2017) (Year: 2017).\*
Thottuvelil et al., High-Frequency Measurement Techniques for Magnetic Cores, IEEE Transactions on Power Electronics, vol. 5, No. 1, p. 41-53, 1990.
(Continued)

*Primary Examiner* — Tung X Nguyen
*Assistant Examiner* — Robert P Alejnikov, Jr.
(74) *Attorney, Agent, or Firm* — Thomas | Horstemeyer, LLP.

(57) ABSTRACT

Various examples of a high frequency, inductor and transformer core loss characterization and measurement method and system for arbitrary waveforms are disclosed herein. A system and method for determining core loss of a magnetic core can include generating a waveform to excite a first test circuit which comprises an excitation circuit, a circuit under test (CUT) comprising the magnetic core, and an inductance circuit having an inductor connected in parallel to the CUT. The method includes measuring a first current, when the first test circuit is excited. The method includes disconnecting the CUT from the first test circuit to form a second test circuit. The method includes generating the waveform to excite the second test circuit, and measuring a second current, when the second test circuit is excited. The power loss for the magnetic core is calculated based on an input voltage and the first and second measured current.

20 Claims, 8 Drawing Sheets

(56) References Cited

OTHER PUBLICATIONS

Mu et al., New Core Loss Measurement Method for High-Frequency Magnetic Materials, IEEE Transactions on Power Electronics, vol. 29, No. 8, 4374-4381, 2014.
Carsten, Why the Magnetics Designer Should Measure Core Loss; with a Survey of Loss Measurement Techniques and a Low Cost, High Accuracy Alternative, HFPC, Proceedings, p. 103-119, 1995.

* cited by examiner

CORE LOSS CHARACTERIZATION AND MEASUREMENT

FEDERALLY SPONSORED RESEARCH STATEMENT

This invention was made with government support under Grant No. 2014-0654-064 awarded by PowerAmerica. The government has certain rights in the invention.

BACKGROUND

Power conversion is related to the conversion of electric power or energy from one form to another. Power conversion can involve converting between alternating current (AC) and direct current (DC) forms of energy, AC to AC forms, DC to DC forms, changing the voltage, current, or frequency of energy, or changing some other aspect of energy from one form to another. In that context, a power converter is an electrical or electro-mechanical device for converting electrical energy. A transformer is one example of a power converter, although more complicated systems, including complex arrangements of diodes, synchronous rectifiers, switching transistors, transformers, and control loops, can be used.

BRIEF DESCRIPTION OF THE DRAWINGS

Many aspects of the present disclosure can be better understood with reference to the following drawings. The components in the drawings are not necessarily drawn to scale, with emphasis instead being placed upon clearly illustrating the principles of the disclosure. In the drawings, like reference numerals designate corresponding parts throughout the several views.

DETAILED DESCRIPTION

Figure 1:
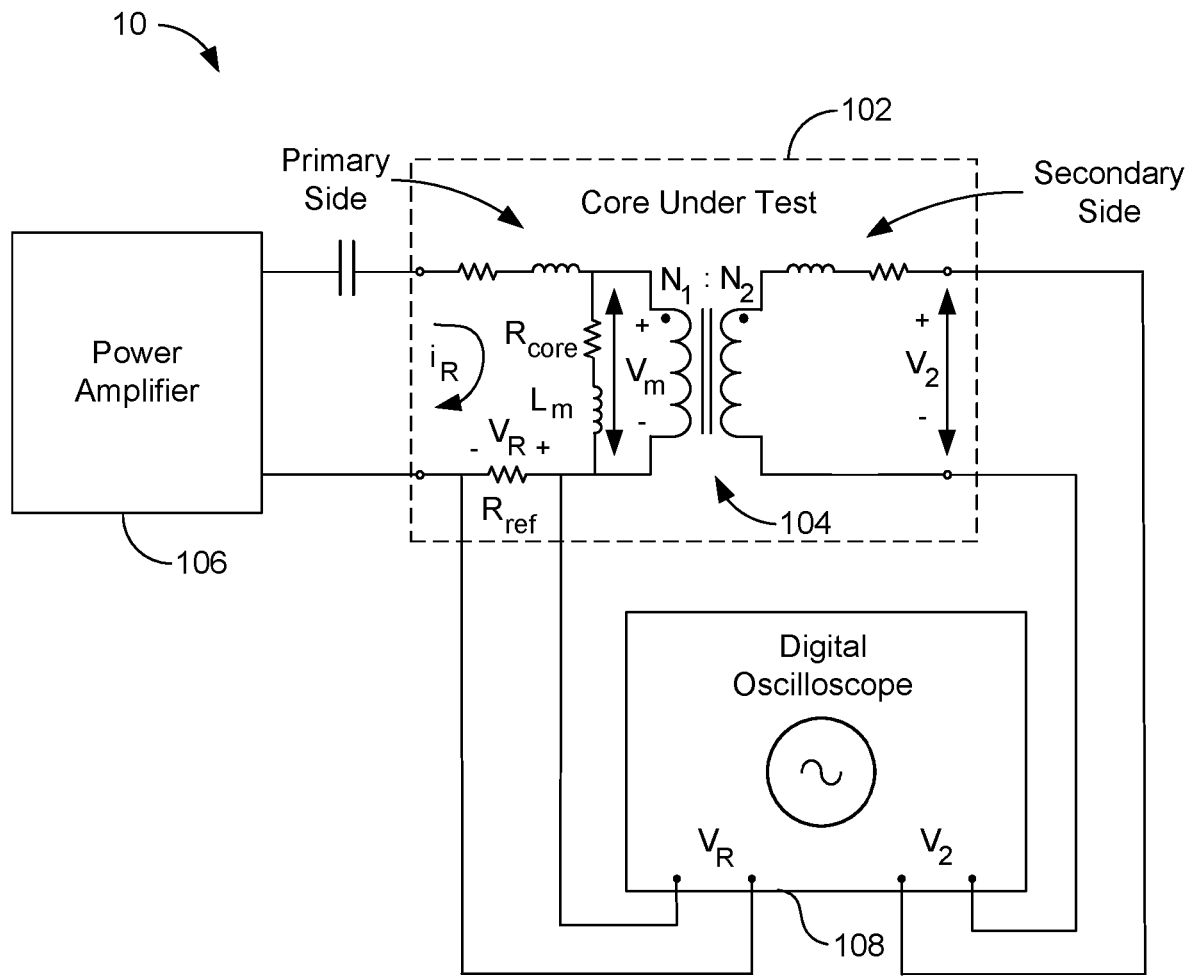
FIG. 1 illustrates an example of a magnetic core under test using a two-winding method according to various embodiments described herein.

As noted above, power conversion is related to the conversion of electric power or energy from one form to another. Power conversion can involve converting between alternating current (AC) and direct current (DC) forms of energy, AC to AC forms, DC to DC forms, changing the voltage, current, or frequency of energy, or changing some other aspect of energy from one form to another. In that context, a power converter is an electrical or electro-mechanical device for converting electrical energy. A transformer is one example of a power converter, although more complicated systems, including complex arrangements of diodes, synchronous rectifiers, switching transistors, transformers, and control loops, can be used.

In the context of power converters, accurate characterization and measurement of inductor and transformer core loss is very important for designing high frequency high power conversion systems. Traditional inductor and transformer core loss measurement methods are limited by the use of low voltage power amplifiers which can only produce ideal sine and square waves. New, alternate-topology power conversion systems are operating with higher voltages, higher frequencies, and arbitrary waveforms. Thus, the industry standard core loss measurement technique that uses a small toroid core excited by a low voltage sine wave is no longer meaningful. There is a need for circuit designers to characterize inductor and transformer core loss with a wide variety of excitation waveforms and excitation amplitudes, such as for applications in high-power resonant converters for electric vehicles or hybrid electric propulsion systems.

In industry, magnetic core manufacturers commonly provide information regarding the properties of the magnetic cores that can be used in transformers. The process generally uses a small sample toroid of a given material to have uniform flux density throughout the core during measurement. The toroid core is wrapped with turns of wire to achieve a desired flux density, then excited with low amplitude sine wave at a given frequency.

In order to find the core loss, a calorimeter or a two-winding method is commonly used. The calorimeter can measure the total core loss in small samples, but the calorimeter machine can be expensive and the process can be time consuming and inaccurate. More frequently, a two-winding method is used to calculate core loss. However, there can be a large error due to phase discrepancy with the two-winding method measurement process.

In the context described above, various examples of a high frequency, inductor and transformer core loss characterization and measurement method and system for arbitrary waveforms are disclosed herein. A system and method for determining core loss of a magnetic core can include generating a waveform to excite a first test circuit which comprises a excitation circuit, a core under test (CUT) comprising the magnetic core, and an inductance circuit having an inductor connected in parallel to the CUT. The method includes measuring a first current, when the first test circuit is excited. The method includes disconnecting the CUT from the first test circuit to form a second test circuit. The method includes generating the waveform to excite the second test circuit, and measuring a second current, when the second test circuit is excited. The power loss for the magnetic core is calculated based on an input voltage and the first and second measured current.

An example of a two-winding test circuit 10 is shown in FIG. 1. In this example, the core under test (CUT) 102 can be wound as a 1:1 transformer 104 with the secondary side acting as a sense winding. It should be noted that the CUT 102 can have other configurations to provide an equivalent circuit depending on the particular test and/or use. As shown in FIG. 1, the example CUT 102 comprises a transformer 104 with a primary side, a secondary side, and a sense resistor $R_{ref}$. The resistance of the core $R_{core}$, and the inductance of the core $L_m$ are part of the transformer 104. The voltage across the magnetic core $V_m$ is measured across the transformer.

In the two-winding test circuit 10, the CUT 102 can be connected to the power amplifier 106 to drive the circuit and to a digital oscilloscope 108 to measure the voltage over the sense resistor $R_{ref}(V_R)$ and the secondary voltage $(V_2)$. The core loss is due to voltage generated by flux and the current required to drive the transformer 104 in an open load. As such, $R_{ref}$ is used to determine the current $I_R$, and $V_2$ represents the voltage generated by the flux. These two components, $V_R$ and $V_2$, allow for the determination of the core loss through the two-winding method. For example, this method is often used to provide the core loss on a datasheet provided by a manufacturer of a magnetic core using the following equations:

$$B = \frac{1}{N_2 A_e} \int_T v_2(t) dt \tag{1}$$

$$P_{core} = \frac{N_1 f}{N_2 R_{ref}} \int_T v_2(t) v_R(t) dt \tag{2}$$

Figure 2:
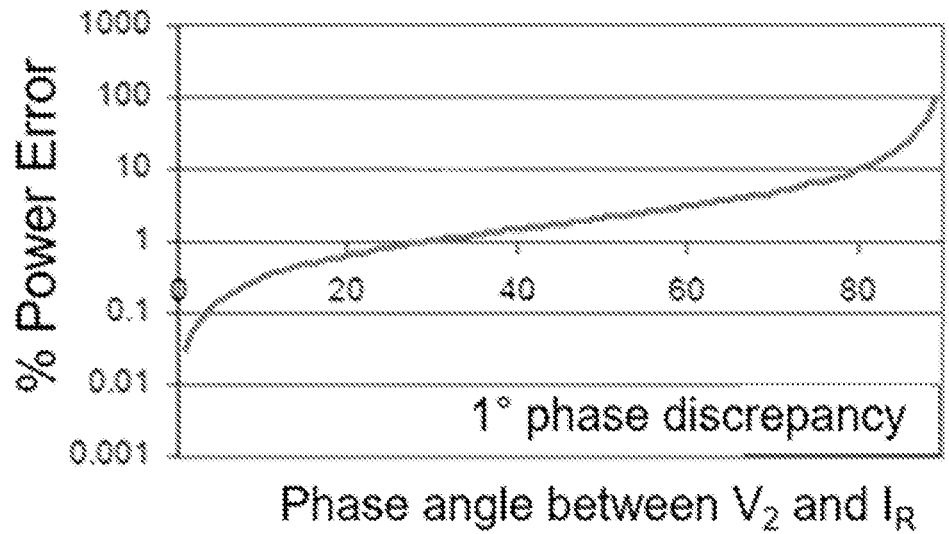
FIG. 2 illustrates an example of the percent error of power with respect to the phase angle difference between $V_2$ and $I_R$ according to various embodiments described herein.

However, there are some challenges with the two-winding method, mainly due to a phase discrepancy between voltage and current waveforms. FIG. 2 illustrates the percent error of power with respect to the phase angle difference between $V_2$, voltage generated by the flux, and $I_R$ current required to drive the given flux density. In this example, there is a large margin of error around the 80 degrees phase between $V_2$ and $I_R$.

Figure 3:
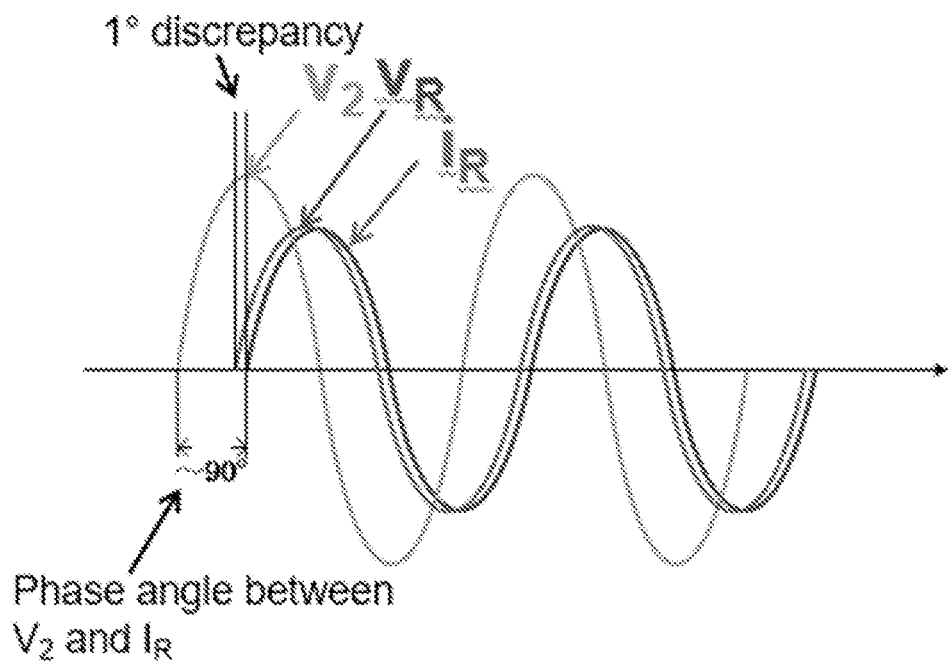
FIG. 3 illustrates an example of the phase difference between $V_2$, $V_R$, and $I_R$ waveforms according to various embodiments described herein.

As shown in FIG. 3, the phase difference between the waveform can introduce a large error for core loss measurement. The phase error can come from many sources in the circuit, such as the parasitics in the circuit. As an extension of the two-winding method, it is possible to apply reactive compensation using a capacitor or an inductor. The type of waveform excitation determines the type of reactive compensation that should be used. The CUT can be modified with a compensation capacitor or compensation inductor to lower the phase angle to a region where the percent error is low.

Figure 4:
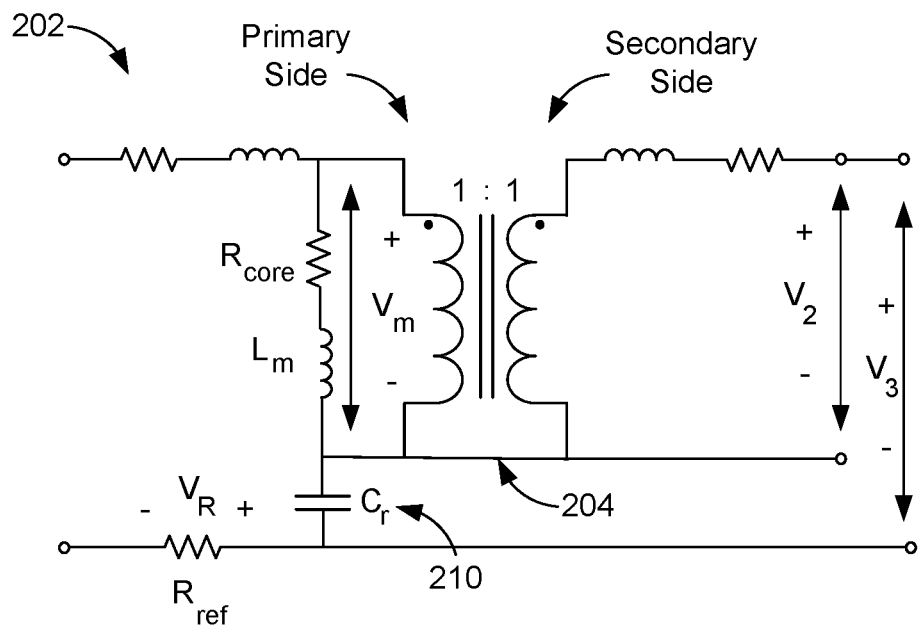
FIG. 4 illustrates an example of reactive compensation, where capacitive cancellation is implemented for a sine wave excitation according to various embodiments described herein.

For example, FIG. 4 illustrates reactive compensation, where capacitive cancellation is implemented by adding a capacitor $C_r$ for a sine wave excitation. In this example, the CUT 202 comprises transformer 204 in an arrangement similar to the CUT 102 of FIG. 1. However, a capacitor $C_r$ is added in series on the primary side for reactive compensation 210, and the secondary voltage $V_3$ including the voltage across $C_r$ can be measured. The following equation can be used to calculate the loss for capacitive cancellation:

$$P_{core} = \frac{1}{TR_{ref}} \int_0^T v_3 v_R dt, \tag{3}$$

where $V_R$ is voltage across the sense resistor $R_{ref}$ and $V_3$ is the voltage across the entire open side of the circuit and secondary side of the core that is being tested. In this case, to generate the excitation waveform, such as a sine wave, a power amplifier with a waveform generator is typically used.

Figure 5:
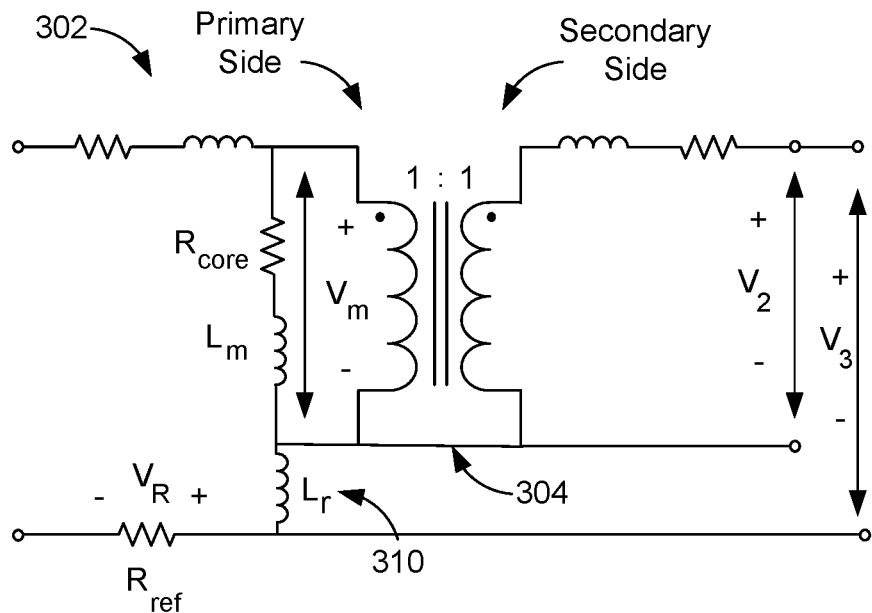
FIG. 5 illustrates an example of reactive compensation, where inductive cancellation is implemented for a square wave excitation according to various embodiments described herein.

In another example, FIG. 5 illustrates a reactive compensation where inductive cancellation is implemented by adding an inductor $(L_r)$ for a square wave excitation. Similar to FIG. 4, CUT 302 comprises transformer 304. The reactive compensation 310 is an inductor, and the secondary voltage $V_3$ including the voltage across $L_r$ can be measured. The following equation can be used to calculate the loss for inductive cancellation:

$$P_{core} = \frac{N_1 f}{N_2 R_{ref}} \int_T v_3 v_R dt, \tag{4}$$

where $V_R$ is voltage across the sense resistor $R_{ref}$ and $V_3$ is the voltage across the entire open side of the circuit and secondary side of the transformer or core that is being tested. In this case, to generate the excitation waveform, such as a square wave, a power amplifier with a waveform generator is typically used.

While the reactive compensation method improves upon the standard two winding method to remove the phase error, some challenges remain. The reactive compensation is limited to using a capacitor for a sine wave and an inductor for a square wave. For example, inductive cancellation (FIG. 5) can be used with a square wave excitation. However, the inductor selection can be complicated, because it is desired to minimize the source or error in the method.

For example, the inductor used for reactive compensation can introduce excess core loss into the measurement that needs to be compensated. To compensate excess core loss from the reactive compensation inductor an air core can be used since it has no core loss, however using an air core will introduce more parasitics and require many turns to achieve the needed inductance value. A low loss reactive compensation inductor can be used, however, there is a need to still compensate for excess core loss, and because of the discrete nature of the inductor, it is hard to control the inductance value needed for reactive compensation. In another example, an adjustable inductor can be used with a tool to adjust the air gap to achieve a wide range of inductor values. Again, it is necessary to compensate for the excess core loss and it requires an expensive and complicated tool in order to achieve the reactive compensation.

Additionally, the two-winding method may be limited due to the power amplifier. In general, the waveform generator and power amplifier configuration does not scale well to high voltages and larger cores. As stated previously, general industry practice for the two-winding method is to use small ferrite cores to provide information on the data sheet. This information may not be representative of the core loss of a larger core operating at high voltages, where the core may not have uniform flux density.

Another limitation of the power amplifier in the two-winding method is the waveform generated. The compensation component (inductor or capacitor) must have the same voltage waveform as the input across it. For example, when using a sine wave, a capacitor is needed for compensation. When using a square wave, an inductor is needed for compensation. However, as the waveform complexity increases, it becomes much harder to achieve reactive compensation. For example, a voltage waveform for a resonant converter has more of a trapezoidal waveform due to soft switching. Depending on the application and configuration of the core under test, a particular waveform may be chosen. Currently, there is no reactive compensation method for these other waveforms (not sine or square wave) or arbitrary waveforms.

As an alternative method, a half bridge can be used to test the core loss with the core under test configured with an open circuit at the output of a half bridge. The core loss is measured by testing the core loss of a no-load half-bridge converter and compensating other losses in the converter. As such, the total power minus all the other source of loss in the network will be the power loss of the core, as follows:

$$P_{core} = V \times A - P_{switch} - P_{cond} - P_{Cap} - P_{Rac} \quad (5)$$

where $P_{switch}$ is power loss due to switching, $P_{cond}$ is power loss due to conduction loss, $P_{Cap}$ is power loss in capacitors, and $P_{Rac}$ is power loss due to the transformer ac resistance $R_{ac}$. However, to achieve zero voltage switching (ZVS) to minimize switching loss, a small magnetizing inductance ($L_M$) is needed. But, small magnetizing inductance results in a large magnetizing current and thus loss on the ac resistance $R_{ac}$ of the primary winding is large. Thus, as an improvement described herein, the two-test parallel inductance method presents a balance between minimizing losses on both switching loss and winding loss.

To overcome the aforementioned limitations, various examples of a high frequency, inductor and transformer core loss characterization and measurement method for arbitrary waveforms are described herein. Instead of focusing on one complicated test to eliminate all of the error, a two-test measurement method has been developed. In one example, inductor and transformer core loss can be accurately and quickly measured through the usage of a soft-switching circuit topology and parallel inductance and a two-test process. For circuit designers, a two-test characterization and measurement method can be practical and convenient. A converter circuit already designed to measure core loss can be used, so no new set up is required. For example, the circuit designer can use a full bridge converter that is already part of a battery charging system to measure core loss in the resonant converter.

Figure 6:
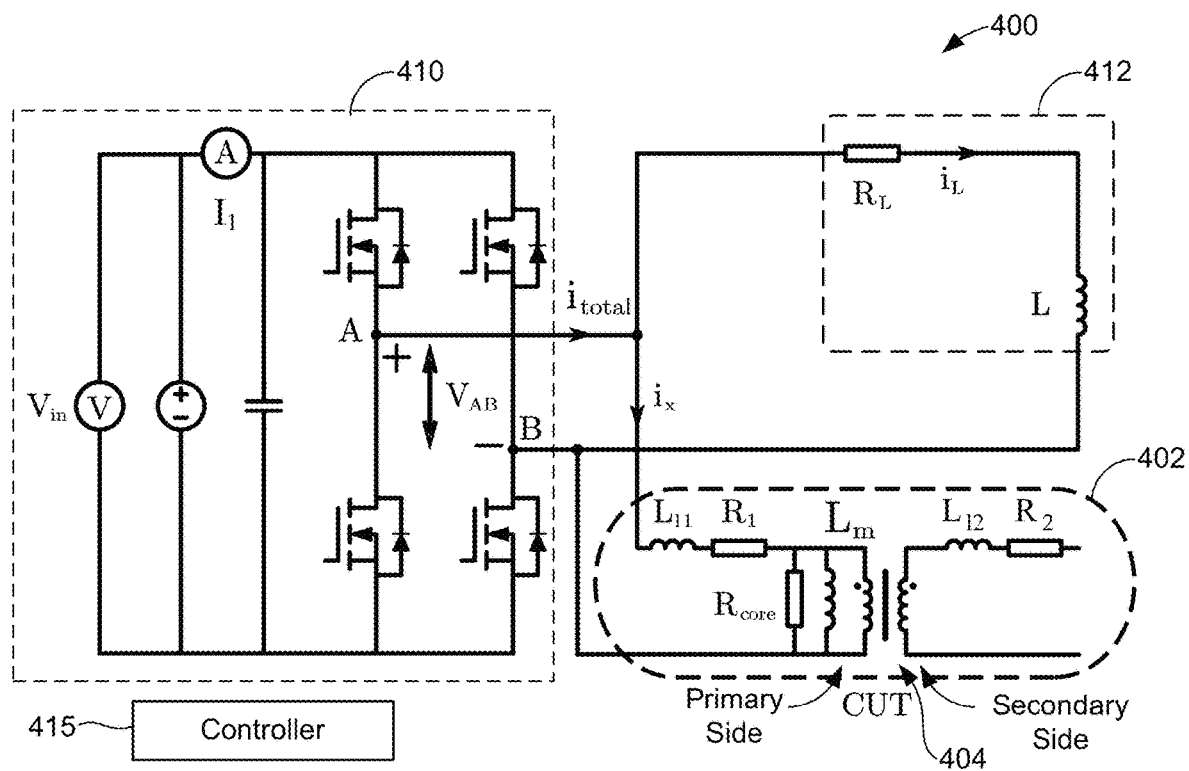
FIG. 6 illustrates an example of a first test circuit including a magnetic core under test and an inductance circuit connected in parallel according to various embodiments described herein.

As shown in FIG. 6, a first test configuration of a first test circuit 400 comprises an excitation circuit 410, an inductance circuit 412, and a core under test (CUT) 402 connected in parallel with the inductance circuit 412. In this example, the excitation circuit 410 includes a DC power supply and a full bridge converter topology, but other types and topologies of excitation circuits can be relied upon. The CUT 402 comprises an inductor or transformer under test. In this example, the CUT 402 comprises a transformer 404 having a primary side and a secondary side. The resistance of the core $R_{core}$, and the inductance of the core $L_m$ are part of the transformer 404. Similarly, for the transformer 404 in the CUT 402 inductance $L_{11}$ and resistance $R_1$ are shown on the primary side and an inductance $L_{12}$ and resistance $R_2$ on the secondary side. The secondary side of the transformer 404 is left as an open circuit.

The inductance circuit 412 is connected in parallel to the CUT 402 as the load to the soft-switching circuit. The parallel inductance L of the inductance circuit 412 is designed to be much smaller than the magnetizing inductance $L_m$ of the inductor or transformer under test. The total current $i_{total}$ is provided by the excitation circuit 410 to both the CUT 402 and the inductance circuit 412, and $i_x$ represents the magnetizing current in the CUT 402. The DC power for the first test configuration is determined via the product of input DC voltage $V_{in}$ and current $I_1$ to the soft-switching circuit.

Optionally, the first test configuration may also include a controller 415 to control certain operations of the first test circuit 400. The controller 415 can be embodied as one or more processors and related circuitry to support the processors, such as one or more memory devices, oscillators, regulators, analog-to-digital converters, digital-to-analog converters, local interfaces, etc. The local interface can include, for example, a data bus with an accompanying address/control bus between memory devices and processors. The processors can include general- or specific-purpose processors, such as microprocessors, microcontrollers, digital signal processors, or other processing circuitry. The controller 415 can also be embodied, at least in part, as one or more discrete logic circuits, application specific integrated circuits (ASICs), programmable logic devices (e.g., field-programmable gate array (FPGAs), and complex programmable logic devices (CPLDs)).

In some cases, one or more processors of the controller 415 can execute computer-readable software or program instructions embodied in a non-transitory computer-readable medium (e.g., memory device). Through execution of the instructions, the controller 415 can be directed to perform one or more of the operations described herein. In other cases, the controller 415 can be designed to conduct or perform the operations described herein without the execution of software.

Figure 7:
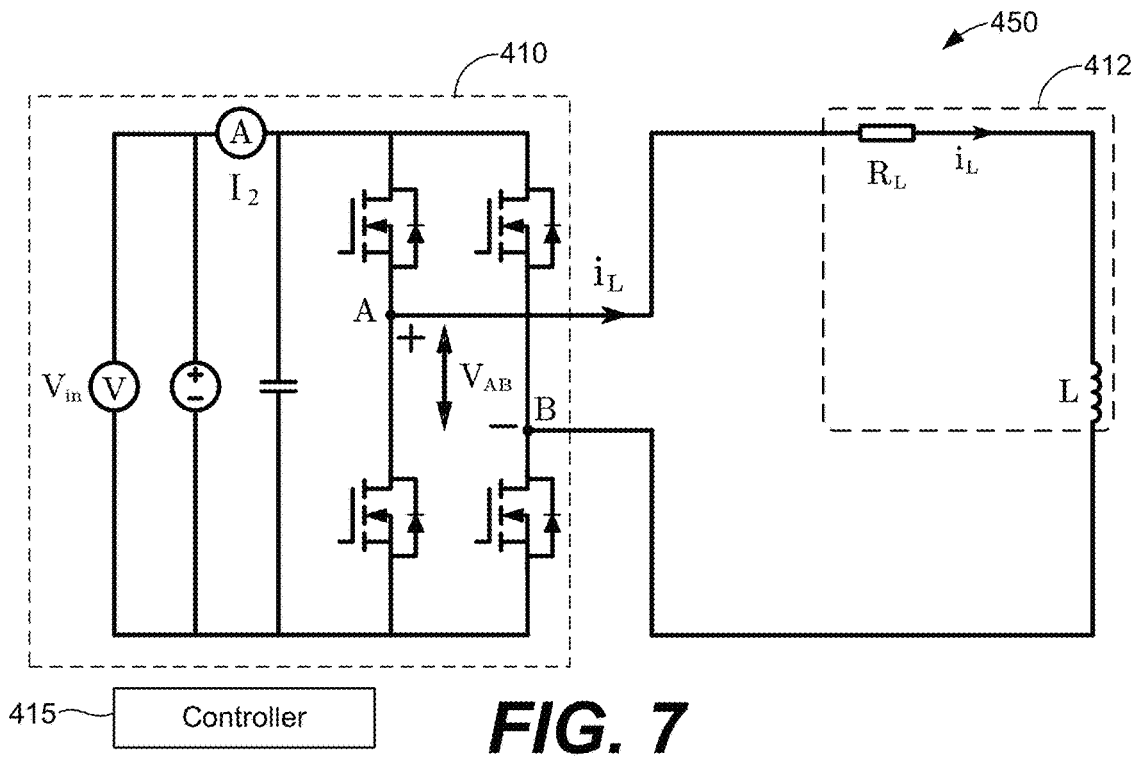
FIG. 7 illustrates an example of a second test circuit including the inductance circuit after disconnecting the magnetic core under test according to various embodiments described herein.

In some cases, the controller 415 is configured to control the operation of the first test circuit 400 shown in FIG. 6, the operation of the second test circuit 450 shown in FIG. 7, and the transition of testing from the first test circuit 400 to the second test circuit 450. Although not shown in FIGS. 6 and 7, the first test circuit 400 and the second test circuit 450 can include electrically-actuated switches, such as relays, transistors, or other contacts to transition between the configuration of the first test circuit 400 to the second test circuit 450, and the controller 415 can control the transition.

The controller 415 can also be configured to measure a voltage or current within the first and second test circuit. The controller 415 can be configured measure the current of the excitation circuit 410 at input. For example, $I_1$ can be measured near the voltage source before the switching network to include switching loss, conduction loss, as well as the load due to the CUT 402 and parallel inductance circuit 412 to determine power consumed. Similarly, $I_2$ can be measured at the same circuit location. The controller 415 can be configured measure the total current $I_{total}$ of the load. For example, $I_{total}$ can be measured at the output of the excitation circuit 410, or $I_{total}$ determined by measuring the current $i_x$ of the CUT 402 and the current $i_L$ of the parallel inductance circuit 412.

As shown in FIG. 7, a second test configuration of a second test circuit 450 comprises the excitation circuit 410 and the inductance circuit 412, without the CUT 402 connected. In this example, the second test configuration 450 can be excited by the same excitation circuit 410 at the same settings as the first test configuration. The second test is performed with only the small magnetizing inductance parallel inductor L connected as the load (the CUT 402 is disconnected). In this example, the CUT has been disconnected in the second test circuit, thus the total current $I_{total}$ is equal to current $i_L$ of the parallel inductance circuit 412. The difference in DC power between the first test and the second test is the resulting core loss for the inductor or transformer under test. Since this two-test measurement method does not rely on a power amplifier, a wide variety of excitation waveforms can be applied to the inductor or transformer under test and any error can be easily compensated. Without the need to rely on a power amplifier, high amplitude excitation can be used, thus any size inductor or transformer can be tested and characterized.

Utilizing the two-test method, core loss in transformers and inductors can be measured with minimal error from phase discrepancy, winding loss, and test fixture loss due to using a soft-switching circuit topology to apply excitation to the inductor or transformer under test and a parallel inductance. The parallel inductance is selected with a low magnetizing inductance to achieve soft switching and be the majority current flow path. The inductor or transformer under test is designed with a high magnetizing inductance and acts as a minority current flow path.

Measurements are taken in two test configurations. The first test involves the inductor or transformer under test and the parallel inductance. Excitation is applied to the soft-switching circuit and the total loss for the first test is calculated based on input current and voltage to the system. The second test involves removing the inductor or transformer under test and applying excitation to the soft-switching circuit with only the low magnetizing inductance as the load. The total loss for second test is calculated based on the input current and voltage to the system. The core loss for the inductor or transformer under test can be determine by the power loss difference between the first test and the second test. Since the method relies on finding the difference between input DC power during the first test and the second test, there is no phase discrepancy error. Winding loss as a source of error is eliminated because the current to the inductor or transformer under test is magnitudes smaller than the current flowing to the parallel inductance and thus the winding loss is a small percent compared to the inductor or transformer loss. Error from the soft-switching circuit topology is easily accounted for using double-pulse test results for the switching devices used in the circuit. Because the two-test measurement method does not use a power amplifier, a wide range of excitation waveforms with various amplitudes can be applied.

The two-test parallel inductance measurement method can be used for the design (but not limited to) of high-power resonant converters for electric vehicles and hybrid electric propulsion system. The accurate characterization of loss on transformer and inductors is critical to achieving high density and reliable design. This method can be used in any application where designers would like to accurately and quickly characterize inductor and transformer core loss.

For example, the first test (FIG. 6) can be configured with a full bridge converter as the excitation circuit 410 with the CUT 402 at the output in parallel with an inductor L in the inductance circuit 412. For the second test (FIG. 7), the same full bridge converter as the excitation circuit 410 with only inductor L in the inductance circuit 412 at the output and the CUT disconnected. The core loss can be determined as follows:

$$P_{core,loss} = V_{in}(I_1 - I_2). \quad (6)$$

Figure 8:
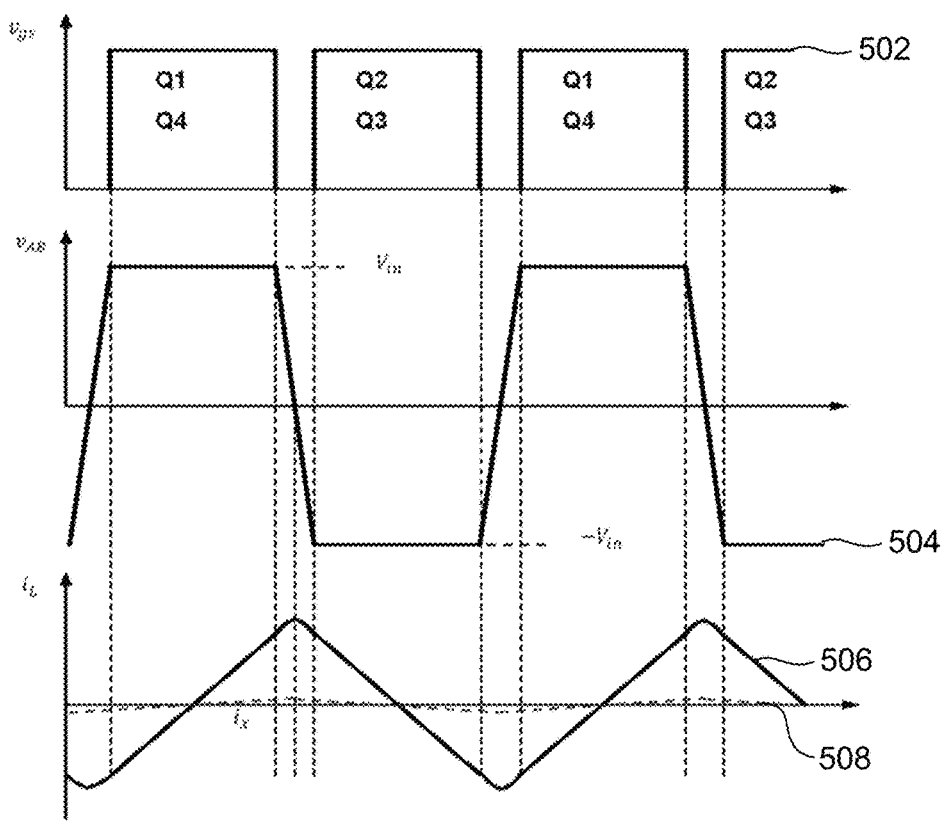
FIG. 8 illustrates an example of the voltage and current waveforms for the first test according to various embodiments described herein.

In this example, a full bridge converter generates a voltage excitation $V_{AB}$, as applied to the first test configuration in FIG. 6. The generated voltage over time $V_{AB}$ is shown as waveform 502 in FIG. 8. Also shown are the voltage yin and current waveforms for the first test. The output voltage is $V_{AB}$, with the current $i_L$ measured over the inductor L compared to current $i_x$ measured over the CUT. The inductor L is chosen to provide parallel inductance L to achieve zero voltage switching (ZVS). In this example, $V_{AB}$ corresponds to the measurement points in FIG. 6, at the output of the full bridge, which forms the trapezoidal waveform 504, formed due to the turn off time in soft switching. Waveform 506 represents the total current $i_{total}$ and 508 represents the CUT current $i_x$ over time. In this example, it is important that L is smaller than $L_M$ in the CUT 402. For example, L=30 μH and $L_m$=120 μH. In this example, the secondary side of the CUT 402 is an open circuit. As such, the power consumed $V_{in}*I_1$ is the power consumed due to:
1) CUT (core+winding)
2) Parallel inductance
3) Switching network In this example, the second test (FIG. 7), uses the same full bridge converter to generate a square wave excitation; however, the CUT is disconnected and the only load is L. Power consumed is $V_{in}*I_2$ is the power consumed due to:
1) Parallel inductance
2) Switching network As such, the core loss can be calculated by evaluating the difference in current according to the following equation:

$$P_{core,loss} = V_{in}(I_1 - I_2). \quad (6)$$

In evaluation of the core loss, conduction loss and switching turn off loss should be considered to eliminate source of error. The conduction loss due to devices and turn-off loss due to switching can be compensated. A known or predetermined device resistance can be used to compensate conduction loss in devices. For example, $R_{ds(on)}$ can be provided by the manufacturer in a datasheet for the devices in the excitation circuit. The power, compensated for conduction loss, can be determined using the total current $I_{total}$ measured current through the CUT in parallel with the inductance circuit of the first test circuit and inductor current $I_L$ across the parallel inductor, as follows:

$$P_{(comp,cond)} = 2(I_{total}^2 - I_L^2)R_{ds(on)}. \quad (7)$$

Additionally, the turn-off loss for devices can be compensated in the two-test process, according to:

$$P_{comp,off} = f_{sw}(E_{off}(i_{total,peak}) - E_{off}(i_{L,peak})), \quad (8)$$

where $I_{total,peak}$ is a peak measured current through the CUT in parallel with the inductance circuit of the first test circuit, $I_{L,peak}$ is a peak measured current through the parallel inductor, $E_{off}$ is turn off energy, and $f_{sw}$ is switching frequency. It is possible to measure core loss under real working waveform that would be used on an actual working circuit. With the two-test parallel inductance measurement method, measuring core loss under real operating conditions is easy.

Through the two-test parallel inductance measurement method, it is very easy to find core loss with real operating waveforms since no reactive compensation is required, such as a trapezoidal waveform in a resonant converter. For example, depending on the resonant converter application, slow or fast dv/dt can be considered. With the two-test parallel inductance measurement method creating waveforms with different dv/dt can be facilitated by changing the parallel inductance value. Parallel capacitors can be included with each device.

Figure 9A:
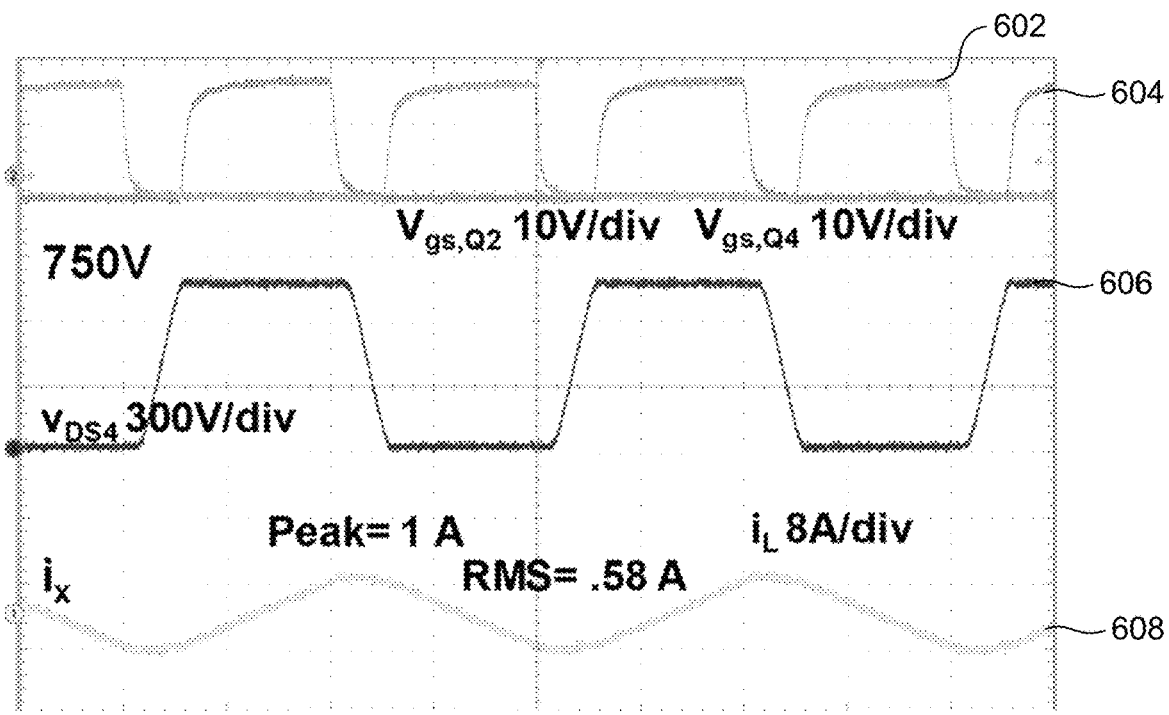
FIG. 9A illustrates an example waveform applied to the first test configuration shown in FIG. 6 and the measured current in the magnetic core under test (CUT) according to various embodiments described herein.
Figure 9B:
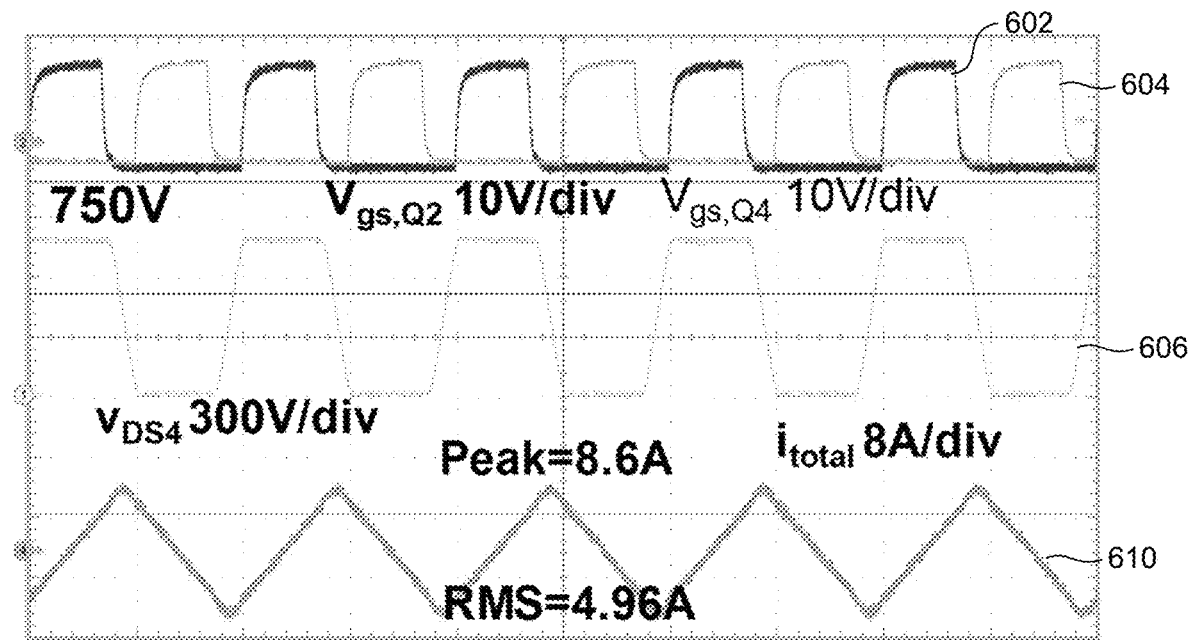
FIG. 9B illustrates an example waveform of FIG. 9A applied to the first test configuration shown in FIG. 6 and the measured total current through the CUT and parallel inductance circuit according to various embodiments described herein.
Figure 9C:
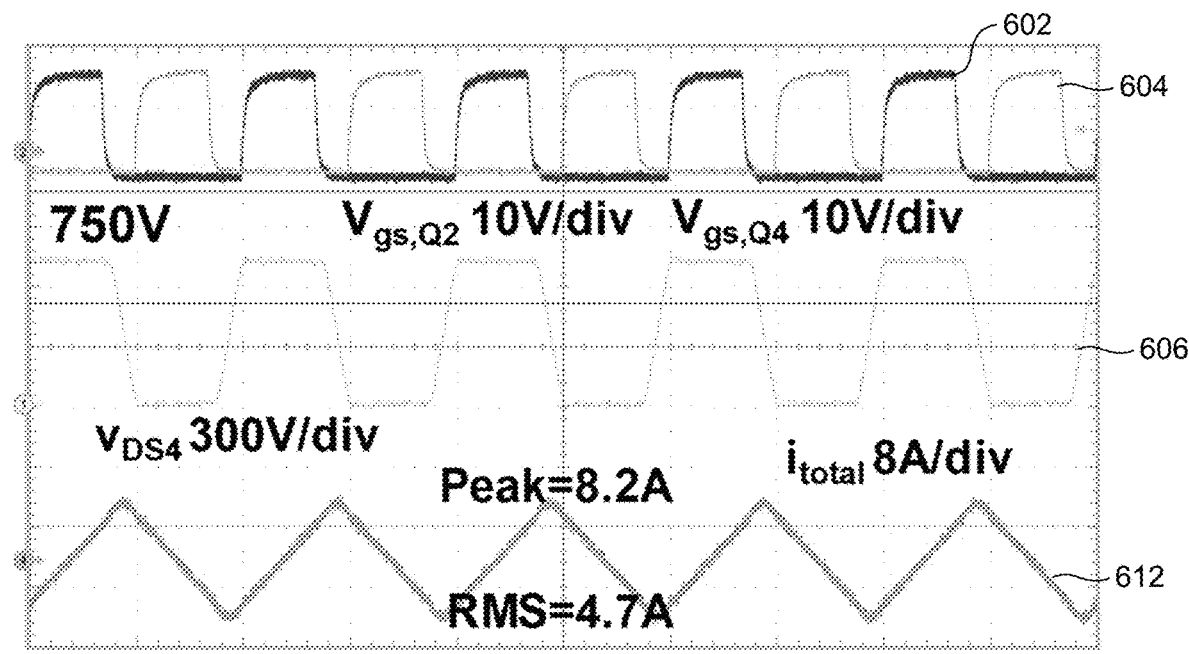
FIG. 9C illustrates an example waveform of FIG. 9A applied to the second test configuration shown in FIG. 7 and the measured total current through the parallel inductance circuit according to various embodiments described herein.

FIGS. 9A-9C illustrate the measured current for an example excitation waveform. FIG. 9A shows an example waveform applied to the first test configuration (FIG. 6) and the measured current in the CUT 402. Similar to FIG. 8, waveforms 602 and 604 represent each half cycle of the generated voltage over time. Waveform 606 depicts the input voltage $V_{in}$ and 608 represents the current over the CUT $i_x$. By keeping the switching network consistent between both tests, error is reduced. The CUT winding loss is typically hard to compensate because the value of $R_1$ is difficult to measure. As such, winding loss introduces large amounts of error. The two-test method is configured such that $i_x<1$ $A_{peak}$ resulting in less than 1 W of winding loss on the CUT 402. Thus, the impact of $R_1$ becomes negligible and can be ignored.

FIGS. 9B and 9C show the measured total current for a first and second test configuration, respectively. Similar to FIG. 9A, waveforms 602 and 604 represent each half cycle of the generated voltage over time. Waveform 606 depicts the input voltage $V_{in}$. The example in FIG. 9B shows the resulting measured the current over the parallel inductor L represented by waveform 610 in the first test circuit (FIG. 6). The example in FIG. 9C shows the resulting measured total current through the parallel inductance circuit in the second test configuration for the example excitation waveform of FIG. 9A. The example in FIG. 9C shows the resulting measured the current over the parallel inductor L represented by waveform 612 in the second test circuit (FIG. 7). The difference of the total current in the two test configurations can be used to calculate the core loss. Further, the two-test method does not require reactive compensation thus true operation waveforms can be used for core loss testing. Although transformers are shown in several of the examples described herein, the two-test method can be used for inductors and transformers. The key to the parallel inductance method is making $i_x$ small and making sure the switching network loss is consistent between both tests.

Figure 10A:
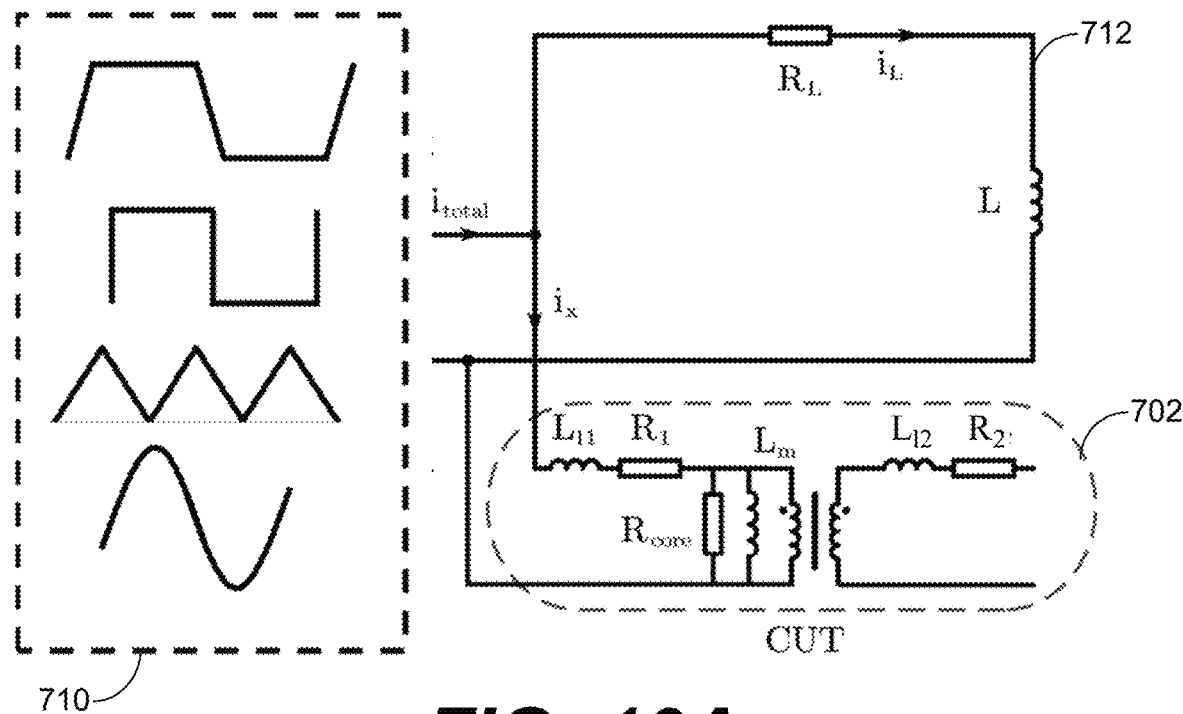
FIGS. 10A and 10B illustrate examples of arbitrary waveforms generated by alternate excitation circuits where the CUT comprises a transformer (FIG. 10A) or an inductor (FIG. 10B) according to various embodiments described herein.
Figure 10B:
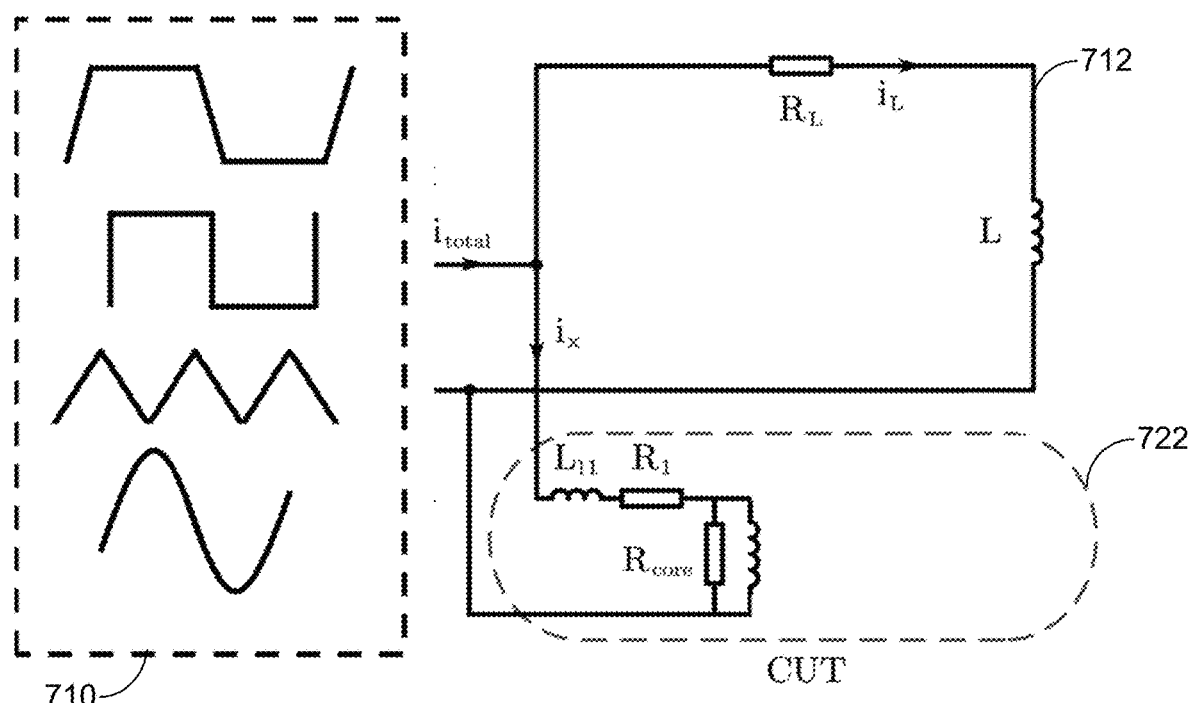

The two-test parallel inductance measurement method does not require reactive compensation, thus true operation waveforms can be used for core loss testing, thus can be used with inductors and transformers with true operating waveforms. The two-test parallel inductance measurement method can be applied universally to many core sizes and waveforms. No waveform compensation is required. As shown in FIGS. 10A and 10B, the two-test parallel inductance measurement method is not limited to a full bridge converter and can be used with other excitation circuits to provide a signal representative of an implementation of the CUT. In the example shown in FIG. 10A has a configuration similar to FIG. 6. However, the excitation circuit 710 can produce an arbitrary waveform, but the CUT 702 and inductance circuit 712 are connected in parallel as previously described. An addition variation is to test an inductor, instead of a transformer in the CUT. FIG. 10B shows the replacement of the CUT 702 with a different CUT 722 comprising an inductor.

Using the two-test parallel inductance measurement method, magnetics companies or circuit designers can quickly and accurately measure core loss. The two-test parallel inductance measurement method enables core loss testing for small and large core sizes. Other methods are limited to small cores due to the constraints such as a power amplifier. The two-test parallel inductance measurement method can be applied for a wide range of core loss measurements at varying frequencies, including converters used in bidirectional applications have non-ideal waveforms.

Circuit designers can find the core loss for true working waveforms under working conditions. For circuit designers, this is practical and convenient. A circuit designer can use converter circuit already designed to measure core loss without requiring a new set up. For example, a circuit designer can use full bridge converter that is already part of a battery charging system to measure core loss in the resonant converter.

Figure 11:
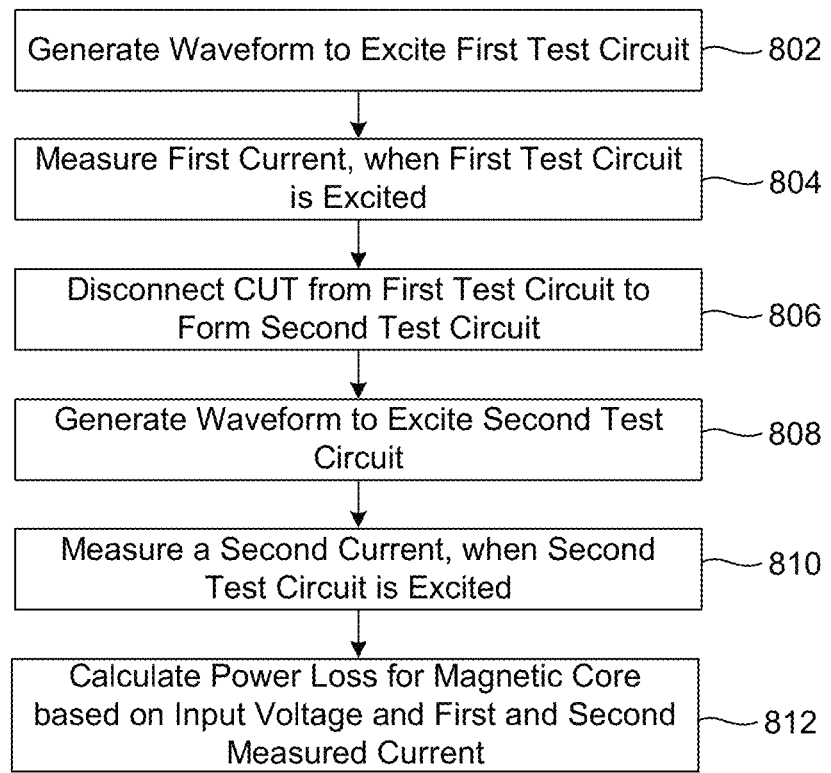
FIG. 11 illustrates a flowchart of the two-test parallel inductance method according to various embodiments described herein.

FIG. 11 illustrates a flowchart of the two-test parallel inductance method according to various embodiments described herein. The method for the two-test parallel inductance method can be implemented using the test configurations shown in FIGS. 6 and 7. In an example, the two-test parallel inductance measurement method can be implemented by using a system comprising a excitation circuit 410, a circuit under test (CUT) 402 including the magnetic core to be tested (such as a transformer or inductor), an inductance circuit 412 having an inductor L, and a controller 415. The system can be configured such that a first test circuit 400 (FIG. 6) can include the excitation circuit 410, the inductance circuit 412, and the CUT 402 connected in parallel with the inductance circuit 412; and a second test circuit 450 (FIG. 7) can include the excitation circuit 410 and the inductance circuit 412.

The controller 415 can be configured to implement the method as shown in FIG. 11. At step 802, the method includes generating a waveform to excite a first test circuit. For example, the controller 415 can direct the excitation circuit 410 to generate one of the waveforms shown in FIG. 10A, to excite the first test circuit 400. At step 804, the method includes measuring a first current at the input voltage, when the first test circuit is excited. Here, the controller 415 can measure the value of the input current $I_1$ before the switching network of the excitation circuit 410.

At step 806, the method includes disconnecting the CUT 402 from the first test circuit 400 to form the second test circuit 450 shown in FIG. 7. At step 808, the method includes generating a waveform to excite a second test circuit. For example, the controller 415 can direct the excitation circuit 410 to generate the same waveform that was used to excite the first test circuit. At step 810, the method includes measuring a second current, when the second test circuit is excited. Here, the controller 415 can measure the value of the input current $I_2$ at the excitation circuit 410. At step 812, the controller can calculate a power loss for the magnetic core based on an input voltage and the first and second measured current collected. Although these steps are shown in order, it can be understood that the steps of the method can be implemented in another order or simultaneously. Other embodiments of this aspect include corresponding computer systems, apparatus, and computer programs recorded on one or more computer storage devices, each configured to perform the actions of the methods.

Implementations may include one or more of the following features. The system where the parallel inductor of the inductance circuit of the first test circuit is configured to provide a low magnetizing inductance to achieve soft switching when the cut is connected in parallel, and the parallel inductor of the inductance circuit of the second test circuit has the same inductance. The system where the CUT is a transformer circuit having a primary side and a secondary side, the transformer circuit having an open circuit on the secondary side. The system where the magnetic inductance of the CUT is greater than the parallel inductor of the inductance circuit. The system where the sample core loss value of the magnetic core is provided. The system where the excitation circuit generates an arbitrary waveform. The system where the arbitrary waveform is a square waveform or trapezoidal waveform. The system where the CUT is a transformer circuit having a primary side and a secondary side, the transformer circuit having an open circuit on the secondary side. The system where the controller is configured to measure at least a first output voltage and a first output current when the first test circuit is excited by the excitation circuit, and a second output voltage and second output current are measured when the second test circuit is excited by the excitation circuit. The system can include a means of calculating a power loss of the magnetic core and based on test measurements of the first test circuit and the second test circuit. Implementations of the described techniques may include hardware, a method or process, or computer software on a computer-accessible medium.

The above-described examples of the present disclosure are merely possible examples of implementations set forth for a clear understanding of the principles of the disclosure. Many variations and modifications can be made without departing substantially from the spirit and principles of the disclosure. All such modifications and variations are intended to be included herein within the scope of this disclosure and protected by the following claims.

Therefore, the following is claimed:

1. A method for determining core loss of a magnetic core, the method comprising:
   generating a waveform to excite a first test circuit, the first test circuit comprising an excitation circuit, a circuit under test (CUT) comprising the magnetic core, and an inductance circuit connected in parallel with the CUT, the inductance circuit comprising a parallel inductor;
   measuring a first current at an input voltage, when the first test circuit is excited;
   disconnecting the CUT from the first test circuit to form a second test circuit;
   generating the waveform to excite the second test circuit;
   measuring a second current at the input voltage, when the second test circuit is excited; and
   calculating a power loss for the magnetic core based on an input voltage, the first current, and the second current.

2. The method of claim 1, further comprising determining an inductance of the parallel inductor of the first test circuit to provide a low magnetizing inductance for soft switching when the CUT is connected in parallel.

3. The method of claim 1, wherein the CUT is a transformer circuit having a primary side and a secondary side, the transformer circuit having an open circuit on the secondary side.

4. The method of claim 1, wherein a magnetic inductance of the CUT is greater than an inductance of the parallel inductor of the inductance circuit.

5. The method of claim 1, wherein the excitation circuit generates an arbitrary waveform.

6. The method of claim 5, wherein the arbitrary waveform is a square waveform or trapezoidal waveform.

7. The method of claim 1, wherein the CUT comprises a test inductor.

8. The method of claim 1, wherein a power loss $P_{(core,loss)}$ of the magnetic core is calculated by $P_{(core,loss)}=V_{in}(I_1-I_2)$, $V_{in}$ is the input voltage, $I_1$ is the first current measured during the first test, and $I_2$ is the second current measured during the second test.

9. The method of claim 8, further comprising:
   compensating for a conduction loss $P_{(comp,cond)}$ of devices in the first test circuit, wherein $P_{(comp,cond)}$ is calculated by $P_{(comp,cond)}=2(I_{total}^2-I_L^2)R_{ds(on)}$, where $I_{total}$ is a measured current through the CUT and the inductance circuit connected in parallel of the first test circuit, $I_L$ is current across the parallel inductor, and $R_{ds(on)}$ is a resistance of devices in the excitation circuit.

10. The method of claim 1, further comprising:
    compensating for a switching turn off loss $P_{(comp,off)}$ of devices in the first test circuit, wherein $P_{(comp,off)}$ is calculated by $P_{(comp,off)}=f_{sw}(E_{off}(I_{total,peak})-E_{off}(I_{L,peak}))$, where $I_{total,peak}$ is a peak measured current of the first test circuit through the CUT and the inductance circuit connected in parallel, $I_{L,peak}$ is a peak measured current of the second test circuit through the parallel inductor, and $E_{off}$ is voltage at turn off.

11. A system for determining core loss of a magnetic core, the system comprising:
    an excitation circuit;
    a circuit under test (CUT) comprising the magnetic core;
    an inductance circuit comprising a parallel inductor;
    wherein:
      a first test circuit comprises the excitation circuit, the inductance circuit, and the CUT connected in parallel with the inductance circuit; and
      a second test circuit comprises the excitation circuit and the inductance circuit; and
    a controller configured to:
      generate a waveform to excite the first test circuit using the excitation circuit;
      measure a first input current, when the first test circuit is excited;
      disconnect the CUT from the first test circuit to form a second test circuit;
      generate the waveform to excite the second test circuit;
      measure a second input current, when the second test circuit is excited; and
      calculate a power loss for the magnetic core based on an input voltage, the first input current, and the second input current.

12. The system of claim 11, wherein the parallel inductor of the inductance circuit of the first test circuit is configured to provide a low magnetizing inductance for soft switching when the CUT is connected in parallel, and the parallel inductor of the inductance circuit of the second test circuit has the same inductance.

13. The system of claim 11, wherein the CUT is a transformer circuit having a primary side and a secondary side, the transformer circuit having an open circuit on the secondary side.

14. The system of claim 11, wherein a magnetic inductance of the CUT is greater than the parallel inductor of the inductance circuit.

15. The system of claim 11, wherein a sample core loss value of the magnetic core is provided.

16. The system of claim 11, wherein the excitation circuit generates an arbitrary waveform.

17. The system of claim 16, wherein the arbitrary waveform is a square waveform or trapezoidal waveform.

18. The system of claim 11, wherein the CUT comprises a test inductor.

19. The system of claim 11, wherein the controller is configured to measure at least a first output voltage and a first input current when the first test circuit is excited by the excitation circuit, and a second input current are measured when the second test circuit is excited by the excitation circuit.

20. The system of claim 19, further comprising a means of calculating a power loss of the magnetic core and based on test measurements of the first test circuit and the second test circuit.

* * * * *